(12) United States Patent
Moyne et al.

(10) Patent No.: US 9,606,519 B2
(45) Date of Patent: Mar. 28, 2017

(54) MATCHING PROCESS CONTROLLERS FOR IMPROVED MATCHING OF PROCESS (71) Applicant: Applied Materials, Inc., Santa Clara, CA (US)

(72) Inventors: James Robert Moyne, Canton, MI (US); Jimmy Iskandar, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 450 days.

(21) Appl. No.: 14/223,780

(22) Filed: Mar. 24, 2014

(65) Prior Publication Data
US 2015/0105895 A1    Apr. 16, 2015

Related U.S. Application Data

(60) Provisional application No. 61/890,802, filed on Oct. 14, 2013.

(51) Int. Cl.
*C23C 16/00* (2006.01)
*F27B 17/00* (2006.01)
(Continued)

(52) U.S. Cl.
CPC ............. *G05B 13/04* (2013.01); *G03F 7/705* (2013.01); *G03F 7/7065* (2013.01);
(Continued)

(58) Field of Classification Search
CPC ...... C23C 16/00; F27B 17/0025; G03F 7/705; G03F 7/70608; G03F 7/70616; G03F 7/70625; G03F 7/70633; G03F 7/7065; G03F 7/70683; G05B 13/04; G05B 19/41865; G05B 19/41875; G05B 2219/2602; G05B 2219/31013; G05B 2219/32096; G05B 2219/32097;
(Continued)

(56) References Cited

U.S. PATENT DOCUMENTS 5,926,690 A * 7/1999 Toprac ................ H01L 22/20
257/E21.525
2002/0199082 A1* 12/2002 Shanmugasundram
........................... B24B 37/042
712/208

(Continued)

OTHER PUBLICATIONS

Moyne et al., Run-to-Run Control in Semiconductor Manufacturing, Introduction (pp. 1-11) and Chapter 3 (pp. 67-79) CRC Press Nov. 2000. 25 pages.

*Primary Examiner* — Robert Fennema
*Assistant Examiner* — Jennifer L Norton
(74) *Attorney, Agent, or Firm* — Lowenstein Sandler LLP (57) ABSTRACT

Described herein are methods and systems for chamber matching in a manufacturing facility. A method may include receiving a first chamber recipe advice for a first chamber and a second chamber recipe advice for a second chamber. The chamber recipe advices describe a set of tunable inputs and a set of outputs for a process. The method may further include adjusting at least one of the set of first chamber input parameters or the set of second chamber input parameters and at least one of the set of first chamber output parameters or the set of second chamber output parameters to substantially match the first and second chamber recipe advices.

18 Claims, 6 Drawing Sheets

(51) Int. Cl.
    G03F 7/20      (2006.01)
    G05B 13/04     (2006.01)
    G05B 19/418    (2006.01)
    H01L 21/66     (2006.01)
    H01L 21/67     (2006.01)
    H05K 3/00      (2006.01)
    H05K 13/00     (2006.01)
    H05K 13/08     (2006.01)
(52) U.S. Cl.
    CPC ...... *G03F 7/70608* (2013.01); *G03F 7/70616* (2013.01); *G03F 7/70625* (2013.01); *G05B 19/41875* (2013.01); *H01L 21/67155* (2013.01); *H01L 21/67253* (2013.01); *H01L 22/20* (2013.01); *H05K 3/00* (2013.01); *C23C 16/00* (2013.01); *F27B 17/0025* (2013.01); *G03F 7/70633* (2013.01); *G03F 7/70683* (2013.01); *G05B 2219/2602* (2013.01); *G05B 2219/32096* (2013.01); *G05B 2219/32097* (2013.01); *G05B 2219/45028* (2013.01); *G05B 2219/45031* (2013.01); *G05B 2219/45032* (2013.01); *H05K 13/00* (2013.01); *H05K 13/08* (2013.01); *Y02P 80/30* (2015.11); *Y02P 90/20* (2015.11)
(58) Field of Classification Search
    CPC ........... G05B 2219/37224; G05B 2219/45026; G05B 2219/45028; G05B 2219/45031; G05B 2219/45032; G05B 2219/45232; H01L 21/67; H01L 21/67155; H01L 21/67167; H01L 21/67184; H01L 21/67242; H01L 21/67248; H01L 21/67253; H01L 21/67259; H01L 21/67265; H01L 21/67276; H01L 21/67288; H01L 22/20; H01L 22/26; H05K 3/00; H05K 13/00; H05K 13/08; Y02P 80/30; Y02P 90/20
    See application file for complete search history.

(56)        References Cited

U.S. PATENT DOCUMENTS

2003/0136511 A1*  7/2003  Balasubramhanya
                                      .......................... G01N 21/274
                                                                 156/345.25
    2004/0044431 A1*  3/2004  Pellegrini ............ G05B 19/418
                                                                 700/121
    2006/0155410 A1*  7/2006  Yamartino ............. G05B 17/02
                                                                 700/108
    2011/0307089 A1* 12/2011  Tomoyasu .......... C23C 16/4405
                                                                 700/103
    2012/0095582 A1*  4/2012  Chen .................... G05B 13/024
                                                                 700/103

* cited by examiner

MATCHING PROCESS CONTROLLERS FOR IMPROVED MATCHING OF PROCESS

RELATED APPLICATIONS

This application claims the benefit of U.S. Provisional Application No. 61/890,802, filed Oct. 14, 2013, the entire contents of which are hereby incorporated by reference in its entirety.

TECHNICAL FIELD

The present application is related to the field of process control and, in particular, to chamber matching.

BACKGROUND

The need to achieve high-yield and throughput levels in the face of ever-decreasing feature size in nano-manufacturing requires improved matching of process chambers. Sustaining a fleet of tools to a matched state (i.e., chamber matching) can reduce yield losses and yield variability, allow for greater routing flexibility in the fab, identify and control process inefficiencies, and reduce time for root cause analysis of issues. Chamber matching is often achieved by using process control (e.g., run-to-run control (R2R control)) to tune each chamber independently from one another to provide the same process outputs, such as target film thickness and uniformity. Unfortunately, only matching the process outputs of different chambers does not necessarily imply that the states of operation of the chambers are matched. To match the states of operation requires that in addition to matching process outputs, process conditions, such as process inputs and process variables should be matched. An example of only matching the process outputs is as follows: furnace chamber 1 could produce a film thickness of 1000 Angstroms with a temperature setting of 100 degrees and a time setting of 1 minute, while chamber 2 produces the same thickness of 1000 Angstroms, with a higher temperature of 110 degrees and a shorter time of 50 seconds. The result is that the chambers are not truly matched from a processing standpoint, and ultimately such non-matched processes significantly decrease yield and throughput.

BRIEF DESCRIPTION OF THE DRAWINGS

The present disclosure will be more readily understood from the detailed description of exemplary embodiments presented below considered in conjunction with the attached drawings, of which.

DETAILED DESCRIPTION

Described herein is a mechanism for implementing an improved definition of chamber matching that matches both input recipes and output values for a process across chambers in a manufacturing facility in a chamber matching effort.

The term "chamber matching" has many definitions. One definition is that two chambers that produce the same output as measured by metrology are matched. That is, the outputs of the chambers are matched without regard to matching the inputs of the chambers. The chambers may be producing the same metrology values in very different ways. For example, furnace 1 uses high-temp and low-time while furnace 2 uses low-temp and high-time to produce the same output (e.g., both produce the same film thickness as measured by metrology), but with very different inputs.

Aspects of the present disclosure provide an improved definition of chamber matching. In the improved definition of chamber matching, chambers are matched if the states of operation of the chambers are matched. Matching the states of operation of the chambers requires than, in addition to matching process outputs, process conditions such as process inputs and process variables are also matched. Process conditions, such as outputs and inputs cannot be exactly matched because there are subtle differences in chambers that generally cannot be avoided, such as time since last maintenance and age of various components. Such an improved definition of chamber matching better aligns processing environments and in application, leads to more consistent quality in product across chambers. Moreover, the improved definition of chamber matching can improve the ability to control input and output parameters across equipment for a process. Additionally, by matching inputs across a process, both measured and unmeasured outputs can increase in consistency and similarity, ultimately helping to increase yield. Hereafter, the term chamber matching refers to the improved definition of chamber matching.

A typical run-to-run (R2R) controller is a model based controller. For example, the model can take the following form:

$$Y = Ax + c,$$

where:

Y=Vector of system outputs, usually measured with metrology, which may be process targets such as thickness and uniformity, x=Vector of system tunable inputs (e.g., portion of recipe), A=Matrix of slope parameters for equation, c=Vector of constant terms for linear model.

The model can be written as a set of equations:

$$y_1 = a_{11}x_1 + a_{12}x_2 + \ldots a_{1m}x_m + c_1$$
$$\ldots$$
$$y_n = a_{n1}x1 + a_{n2}x_2 + \ldots a_{nm}x_m + c_n$$

Traditionally, R2R controllers often update model terms on an R2R basis (e.g., after each run), based on the difference between the predicted "y" (i.e., output) and the actual "y". Methods such as Exponential Weighted Moving Average (EWMA) are leveraged for smoothing and incorporating historical information into the update process. For example, each "c" can be updated at run "t" by: $c_t=\alpha(y_t-A_{xt})+(1-\alpha)c_{t-1}$, where α is a forgetting factor (0≤α≤1).

Depending on the number of outputs being controlled and number of tunable inputs, the process matching problem can be underdetermined, exactly determined, or overdetermined. In practice, process matching problems are almost always underdetermined. If the solution is underdetermined, an infinite number of solutions (i.e., sets of inputs that produce the desired outputs, also called "advices") exist. The aforementioned is generally true only if a sufficient number of inputs are not "railed" (i.e., forced to stay at a limit value and therefore, not adjustable R2R). Technically, if the solution is overdetermined, a number of solutions that generate the same outputs that are "close" to the targets can be generated.

Traditionally, R2R controllers, when faced with an infinite solution space, choose the "advice" that is "closest" to the previous advice. Said differently, the next solution is chosen by its closeness to the previous solution. Choosing the advice that is closest to the previous advice can be determined with techniques such as constrained Least Squares. Variables can be weighted relative to each other to adjust the definition of "closeness" to the particular application.

Aspects of the present disclosure provide a solution that not only satisfies the minimal definition of chamber matching but also the improved definition of chamber matching, hereinafter called a chamber matching effort. That is, aspects of the present disclosure can match process conditions, such as input recipes as well as output (e.g., metrology) values in a chamber matching effort. For example, an example process includes tunable inputs (e.g., pressure and temperature) and outputs (e.g., thickness). The tunable input types and output types may be the same across chambers. That is, pressure and temperature may be controlled at each chamber. However, the values (e.g., parameters) of the inputs may be tuned in order to obtain output targets. It should be noted, that output parameters may also be called output targets. In a chamber matching effort, both the input values (e.g., input parameters) and output values (e.g., output parameters or targets) may be adjusted so that they approximate one another. For example, to maintain a constant output value (e.g., thickness of 10 micrometers), pressure and temperature values may be adjusted to approximate 10 Bar and 250° C., respectively, across all the chambers in a chamber matching effort. Aspects of the present disclosure adjust the concept of closeness in chamber matching to incorporate recipe recommendations across chambers, so that outputs as well as inputs are matched as much as possible across a set of chambers. Aspects of the present disclosure leverage the fact that an R2R controller has a choice of recipe advices (i.e., a set of inputs that produce the desired outputs), usually infinite, that can provide an R2R control action.

Aspects of the present disclosure can determine a multi-chamber composite average recipe advice (e.g., a target recipe, composite chamber recipe advice). A composite chamber recipe advice may be the average of all chamber recipes for a particular process. The composite recipe advice may include tunable inputs and outputs, and a set of composite input parameters and a set of output parameters to tune the tunable inputs and outputs, respectively. For example, tunable inputs may be temperature and pressure and may have parameters of 100° C. and 20 Bar, respectively. An output may be thickness and have a parameter or target of 10 Micrometers. A composite chamber recipe advice may be used in a chamber matching effort where the recipe advice of each chamber is adjusted to approximate the composite chamber recipe advice. For example, the input parameters and the output parameters of a particular chamber recipe advice may be tuned to more closely approximate the input parameters and output parameters of the composite chamber recipe advice. In another example, prior to each of a chamber's process run, an associated R2R controller may send a R2R advice request to ensure that the chamber recipe advice is the closest to the composite recipe advice. All the R2R controllers may track (i.e., stay very close to) each other with respect to composite recipe advice while still providing R2R control.

Aspects of the present disclosure describe a continuous update of the composite recipe advice. After a chamber's associated R2R controller sends out an R2R advice request and in response, the chamber recipe advice has been updated to approximate the composite recipe advice, the composite recipe advice may be further updated by incorporating the newly updated chamber recipe advice into an updated composite recipe advice.

Some aspects of the present disclosure describe weighting methods used to favor or prioritize particular parameters (e.g., input and output parameters) for matching. Aspects of the current disclosure also describe how weighting methods work with enhanced R2R control capabilities such as, virtual metrology enhanced R2R control. Aspects of the current disclosure are not limited to fabrication, but may be applied in any process, such as industrial controls and manufacturing, generally.

According to some aspects of the present disclosure, chamber matching may be described mathematically. A set of 'k' chambers to be matched is defined. An R2R controller for each chamber may use the following equations to describe outputs and inputs:

$$y_1 = a_{11}x_1 + a_{12}x_2 + \ldots a_{1m}x_m + c_1$$
$$\ldots$$
$$y_n = a_{n1}x1 + a_{n2}x_2 + \ldots a_{nm}x_m + c_n$$

The physical parameter related to each $y_i$ (1≤i≤n) and $x_j$ (1≤j≤m) is the same for all chambers (1 through k). Note the values for "a" and "c" are not required to be the same for each chamber.

According to some aspects of the present disclosure, determining the composite chamber recipe advice across chambers is performed by averaging each input parameter across the chambers. In some embodiments, determining the composite chamber recipe advice across chambers includes averaging the models across each chamber of a group of chambers and inverting the composite model to determine the average recipe. The average recipe advice is one type of composite recipe advice, $X_c$.

According to some aspects of the present disclosure, every time there is an R2R control model adjustment at any chamber, the chamber matching method can determine the recipe advice that meets the control criteria that is the closest to the composite advice, $X_c$. For example, minimize $\|X-X_c\|^2$ and update $X_c$, given the new recipe advice X. In another embodiment, the recipe advices of each chamber in the matching group are tied to the other chambers.

According to some aspects of the present disclosure, parameters (e.g., tunable inputs and outputs) are weighted to contribute more or less to the averaging and movement towards average. For example, in an exemplary recipe advice the power settings may be weighted more than the time settings. The weighting of input parameters (e.g., tunable inputs) or outputs (e.g., outputs) can allow a chamber's inputs to be matched to parameters that are most important to the customer. For example, pressure can be weighted more heavily than power so that the chambers, while producing the same output, also use the same or similar pressure input. Alternatively, the weighting of input to output parameters can allow matching of input parameters at the expense of output parameter matching. Said differently, in some instances controlling inputs may be more important than controlling the output. The weighting of individual chambers can dictate the level at which each chamber contributes to the matching or derives advice from the matching. For example, a particular process chamber may be near ideal (e.g., a "golden" chamber), and may be weighted more heavily than other less ideal chambers when calculating the composite recipe advice.

According to some aspects of the present disclosure, chamber matching can be used with enhanced R2R control techniques, such as virtual metrology aided R2R control.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Figure 1A:
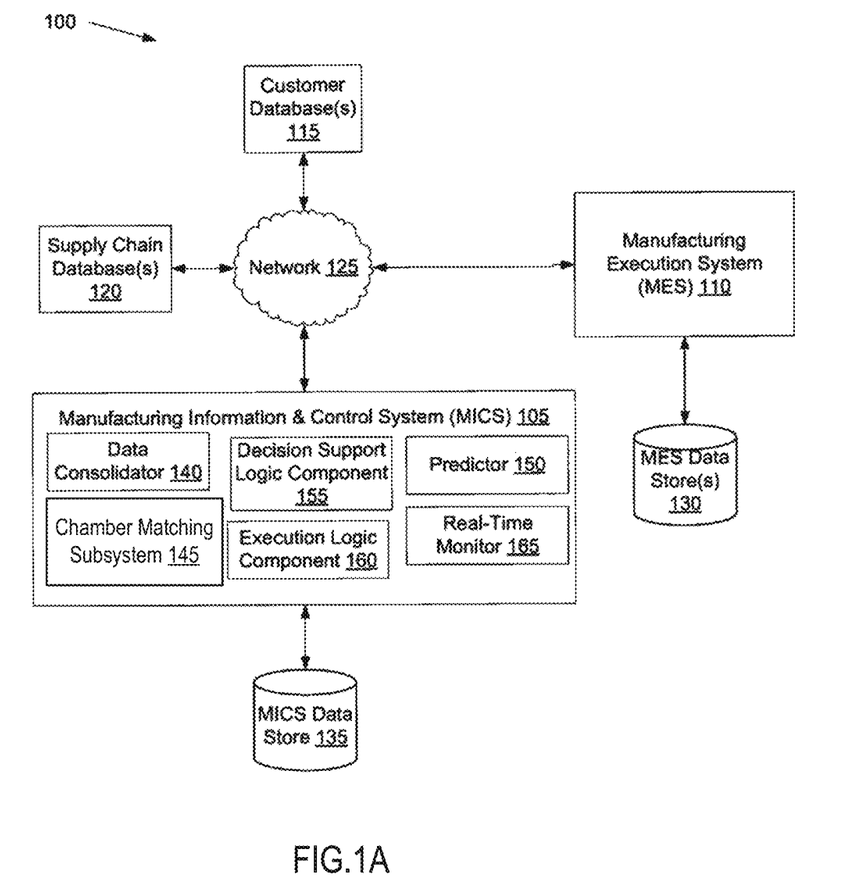
FIG. 1A illustrates an exemplary architecture of a manufacturing environment, in which embodiments of the present invention may operate.

FIG. 1A illustrates an exemplary architecture 100 of a manufacturing environment, in which embodiments of the present invention may operate. The manufacturing environment may be a semiconductor manufacturing environment, an automotive manufacturing environment, etc. In one embodiment, the architecture 100 includes one or more supply chain databases 120, one or more customer databases 115, a manufacturing execution system (MES) 110 and a manufacturing information and control system (MICS) 105, connected via a network 125.

The network 125 may be a public network (e.g., Internet), a private network (e.g., Ethernet or a local area Network (LAN)), or a combination thereof. The network 125 may include multiple private networks, which may be directly connected or connected via a public network. For example, the supply chain database 120 may be connected to a first private network controlled by suppliers of the manufacturing environment, the customer database 115 may be connected to a second private network controlled by a customer of the manufacturing environment, and the MICS 105 and MES 110 may be connected to a third private network. Each of these private networks may be connected via a public network.

A supply chain database 120 includes information available to and/or provided by a supplier or distributor. Such information may include, for example, a supplier's orders (e.g., of parts and goods), supplier inventory (e.g., current inventory, projected inventory, etc.), projected delivery dates, etc. Where materials are received from multiple distributors or suppliers, architecture 100 may include multiple supply chain databases 120. For example, a first supply-chain database may include information on raw goods, and a second supply-chain database may include information on manufacturing equipment.

A customer database 115 includes information available to and/or provided by a customer. Such information may include, for example, customer demand for specified articles of manufacture, customer inventory, etc. Architecture 100 may include a single customer database 115 for multiple customers, or multiple customer databases 115, each of which provides information about a distinct customer.

The manufacturing execution system (MES) 110 is a system that can be used to measure and control production activities in a manufacturing environment. The MES 110 may control some production activities (e.g., critical production activities) or all production activities of a set of manufacturing equipment (e.g., all photolithography equipment in a semiconductor fabrication facility), of a manufacturing facility (e.g., an automobile production plant), of an entire company, etc. The MES 110 may include manual and computerized off-line and/or on-line transaction processing systems. Such systems may include manufacturing machines, metrology devices, client computing devices, server computing devices, databases, etc. that may perform functions such as processing, equipment tracking, dispatching (e.g., determining what material goes to what processes), product genealogy, labor tracking (e.g., personnel scheduling), inventory management, costing, electronic signature capture, defect and resolution monitoring, key performance indicator monitoring and alarming, maintenance scheduling and so on. In one embodiment, the MES 110 is connected with one or more MES data stores 130. The MES data stores 130 may be databases, file systems, or other arrangements of data on nonvolatile memory (e.g., hard disk drives, tape drives, optical drives, etc.), volatile memory (e.g., random access memory (RAM)), or combination thereof. Each MES data store 130 may store, for example, historical process information of manufacturing recipe advices (e.g., temperatures, pressures, chemicals used, process times, etc.), equipment maintenance histories, inventories, etc.

The manufacturing information and control system (MICS) 105 combines disparate information from multiple different sources (e.g., data stores), and presents this information in a single interface. The MICS 105 can be used to gain an understanding of the manufacturing environment, and can enable a user to determine an efficiency of the manufacturing environment and/or how to improve all or components of the manufacturing environment. The MICS 105 may be used to control chamber matching efforts in a manufacturing environment. The MICS 105 may also draw inferences from, report out, and/or act upon the combined information. For example, MICS 105 can act to determine different chamber recipe advices, adjust different chamber recipe advices, generate composite chamber recipe advices, provide bottleneck analysis, provide asset management (e.g., reduce unscheduled equipment downtime), improve lean practices, etc. In one embodiment, MICS 105 includes a data consolidator 140, a decision support logic component 155, an execution logic component 160, a predictor 150, a real-time monitor 165, and a chamber matching subsystem 145.

The data consolidator 140 consolidates received data of manufacturing equipment (e.g., chambers) from multiple different sources (e.g., data stores). The manner in which the received data from the data sources is consolidated may be dependent upon relationships between the received data. Such relationships may be user defined. Moreover, sources from which data is consolidated, and the manner in which data is consolidated, can be user configurable. Therefore, as new data stores are added and/or old data stores are removed, data consolidator 140 may be adapted to accommodate the change.

In one embodiment, data consolidator 140 consolidates data from multiple MES data stores 130 (e.g., an inventory data store, a maintenance data store, a metrology data store, process data stores, etc.). In a further embodiment, the data consolidator 140 consolidates data from the supply chain databases 120 and/or customer databases 115. In yet a further embodiment, data consolidator 140 consolidates real-time data as the data is collected by real-time monitor 165 (e.g., from manufacturing machines (chambers) and metrology machines). In still a further embodiment with a predictive model, data consolidator 140 consolidates virtual data that has been generated by predictor 150. Data consolidator 140 can also consolidate manually entered data (e.g., data entered by a device operator, maintenance personnel, etc.). In another embodiment, data consolidator 140 consolidates past and present recipe advices for k-number of chambers or manufacturing equipment.

In one embodiment, data consolidator 140 stores consolidated received (actual) data in MICS data store 135. Alternatively, data consolidator 140 may store a subset of all consolidated received data in MICS data store 135. For example, data consolidator 140 may store consolidated data necessary to generate a composite chamber recipe in MICS data store 135.

Real-time monitor 165 collects real-time data that includes present values of one or more equipment parameters (e.g., input and output parameters). Such real-time data may be collected from sensors and systems to which MICS 105 is connected via network 125. Real-time monitor 165 may, for example, collect data from manufacturing equipment (e.g., chambers) and metrology equipment (e.g., chambers) as the data is generated. In one embodiment, real-time monitor 165 provides the real-time data to data consolidator 140.

Decision support logic component 155 can provide recommendations and decisions on chamber matching based on the historical and current operational status (e.g., received data of past and present chamber recipe advices). Decision support logic component 155 may also provide recommendations and decisions on chamber matching based on future operational status (e.g., desired output values and/or virtual data). The decision support logic component 155 may provide such recommendations and decisions based on business logic that matches a set of values with an outcome. The outcome may, for example, cause maintenance personnel to be notified of a pending machine failure, cause a process engineer to be notified of abnormal measurement results, etc. The outcome may also recommend actions to be taken. For example, the outcome may recommend that particular maintenance be performed on a machine.

Execution logic component 160 can be responsible for taking action on the business systems based on the output of the decision support logic component 155. These actions are in the form of intelligent business rules that can be launched either through real-time system events, predicted events, or scheduled activities. For example, execution logic component 160 may automatically schedule maintenance for a machine when certain values are detected, automatically shut down the machine, etc.

MICS 105 may also include a chamber matching subsystem (CMS) 145. The CMS 145 uses the data in the MICS data store 135 to perform chamber matching efforts for various tools and chambers in the manufacturing environment. Chamber matching can be performed by components of the MES 110 which may forward the associated process data to the MICS 105. Alternatively or in addition, chamber matching can be performed by the MICS 105 based on equipment parameters (e.g., tunable inputs, outputs, input parameters, output parameters) received from the MES 110 and/or from other sources in the manufacturing environment. Chamber matching can be performed using specific chamber methods (e.g., state space control, EWMA, etc.), which can be static or change over time. The CMS 145 may also perform analysis of equipment data stored in the MICS data store 135 to define a composite recipe advice.

In one embodiment, the CMS 145 provides a GUI that allows a user to select a specific tool, presents outputs and tunable inputs available for the selected tool, and allows the user to select and tune one or more of the presented outputs and tunable inputs. The CMS 145 may allow the user to tune the set of tunable inputs and the set of outputs by adjusting input and output parameters.

In some embodiments, the CMS 145 controls a set of 'l' chambers to be matched. The number of chambers, 'k,' may be defined by a user or a process administrator of MICS 105. The CMS 145 may define an R2R controller for each chamber in the form of an equation, for example a number of outputs defined by a number of tunable inputs and a chamber constant. The CMS 145 may tune the outputs by using output parameters and may tune the inputs by using input parameters. For example, in a semiconductor process, wafer thickness may be the output while time and temperature may be the controllable inputs. Continuing the example, the CMS 145 may perform chamber matching by tuning the time and temperature parameters so that both the output (e.g., the defined thickness) and the inputs (e.g., the values of time and temperature) converge across the 'k' chambers.

In some embodiments, the CMS 145 determines a composite recipe advice across 'k' chambers. For example, the CMS 145 may simply average each input coefficient across the 'k' chambers to determine a composite recipe advice. In another example, the CMS 145 may average the recipe advices across 'k' chambers to determine a composite recipe advice. In yet another example, a user may define an alternative method of computing a composite recipe advice for CMS 145 to perform. The CMS may communicate with MES 110, to control the manufacturing equipment so that the inputs and outputs of the 'k' chambers converge as a result of the composite recipe advice.

In one embodiment, the CMS 145 may weight certain tunable inputs and/or outputs more or less across the 'k' chambers when determining the composite recipe advice. Additionally, the CMS 145 may weight a particular chamber more or less when determining the composite recipe advice. In one embodiment, the CMS 145 may determine the different weights automatically. For example, if the input, 'time', has been weighted by a user, the CMS may automatically adjust the weights of inputs and outputs to ensure that the additional weight for 'time' has been appropriately accounted for. In an alternate embodiment, a user may define different weights and input those weights into MICS 105 and/or CMS 145.

In some embodiments, any time an R2R control model adjustment at any chamber is made, CMS 145 updates the composite recipe advice. The CMS 145 may retrieve R2R data from MES data store 130 and store the information in MICS data store 135.

In another embodiment, CMS 145 may extend its chamber matching efforts with enhanced techniques such as virtual aided R2R control. In one embodiment with a predictive model, data consolidator 140 consolidates virtual data that has been generated by predictor 150. Data consolidator 140 may store consolidated data necessary to generate virtual data in MICS data store 135. The methods, models and/or algorithms used to generate virtual data may depend on the parameter being predicted. For example, a first simulation model may be used to predict future values of a first parameter, and a second simulation model may be used to predict future values of a second parameter. In one embodiment, CMS 145 may use the virtual data and the actual data to generate a composite recipe advice. In another embodiment, CMS 145 may use the virtual data to control the input and output parameters in a chamber matching effort.

Though the exemplary architecture 100 described above is of a manufacturing environment, embodiments of the present invention may also operate in other environments such as an investment environment (e.g., for trading stocks, bonds, currencies, etc.), a research environment, etc. In such alternative environments, no manufacturing execution system may be present, and the manufacturing information and control system may instead be a research information and control system, investment information and control system, etc.

Figure 1B:
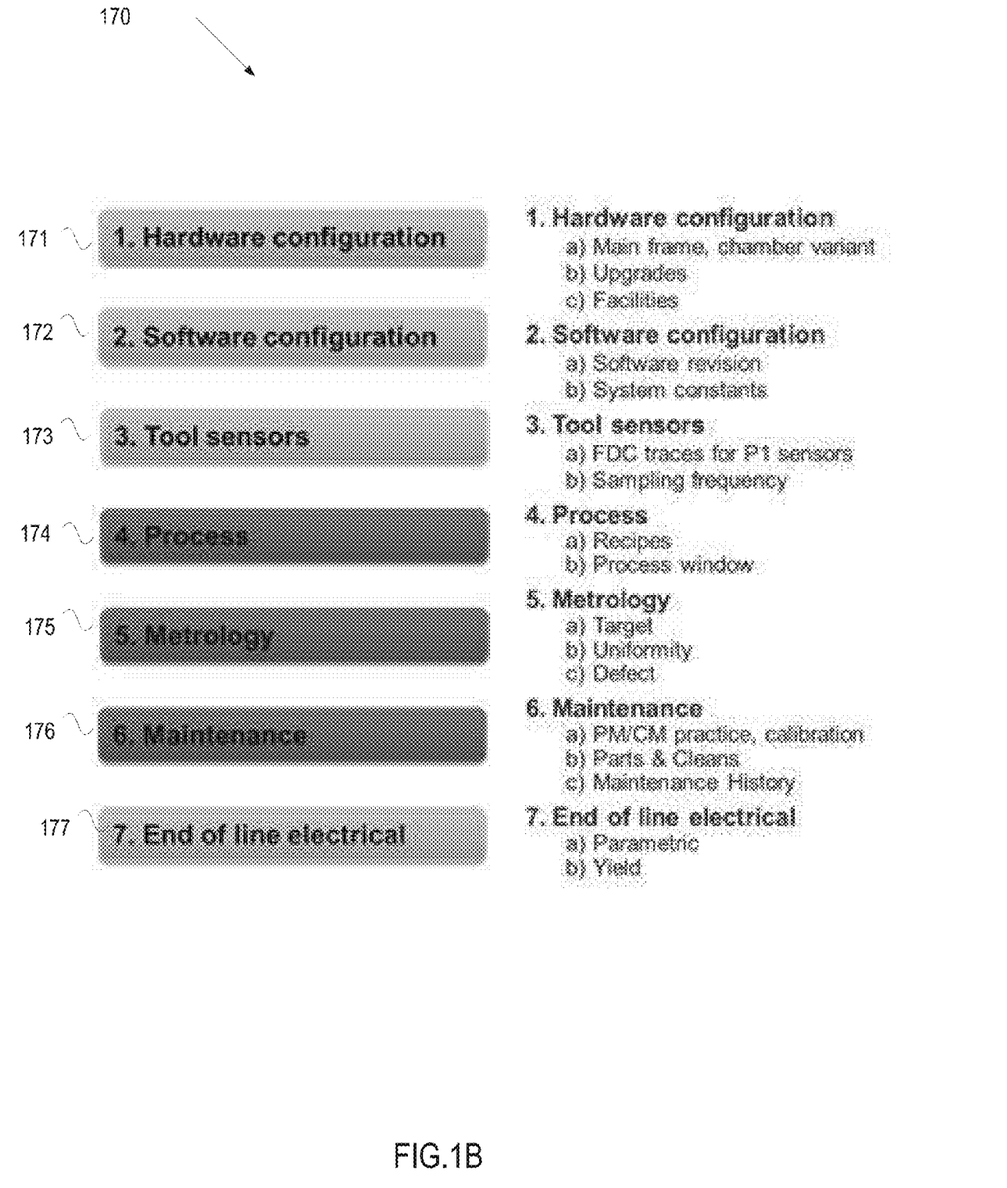
FIG. 1B illustrates a multi-dimensional solution to chamber matching, according to some aspects of the present disclosure.

FIG. 1B illustrates a multi-dimensional solution to chamber matching, according to some aspects of the present disclosure. FIG. 1B illustrates some dimensions of the chamber matching effort, including, hardware configuration 171, software configuration 172, tool sensors 173, process 174, metrology 175, maintenance 176, and end of line electrical 177. As mentioned above, sustaining a fleet of tools to a matched state can reduce yield losses and yield variability, allow for greater routing flexibility in the fab, identify and control process inefficiencies, and reduce time for root cause analysis of yield issues. A comprehensive solution to chamber matching includes matching across many dimensions, as depicted in FIG. 1B. Ideally, the matching process provides for matching in every available dimension, from configuration (e.g., hardware configuration 171 and software configuration 172) through process setup and execution, and yield analysis, as shown in FIG. 1B. The first step in the matching process is to perform a hardware and software audit. In many cases, a "Golden Tool" is identified as part of a collaborative effort between the customer and operator. The hardware and software parameters of the golden tool may become a baseline. A determination may be made as to what parameters are important to the matching process and what level of matching needs to be obtained.

When the hardware configuration 171 and software configuration 172 are matched, effort may be turned to matching tool sensors 173 and data collection. Data collection and analysis configurations may be matched and analysis capabilities such as "chamber variance reporting," are used to determine the level of chamber matching as well as investigate sources of any mismatch. Often remedies involve identifying underperforming chambers and matching input and output parameters to "golden" chambers. For example in a poly etch matching process, drive current (Ion) matching may be improved from a difference of 7% to 0%. Drive current standard deviation within a wafer may be reduced by 30%. The matching may be achieved by matching gas flows, equipment constraints, RF parameters, and recipe optimization.

The capabilities identified above aid the chamber matching process and yield a number of benefits. However, they are generally applied off-line and may not address chamber matching during production, in for example, process 174, metrology 175, and maintenance 176. As noted above, one definition of chamber matching during production is to match outputs by post process metrology. When only matching the outputs across a fleet, chambers can be operating very differently. An improved definition of chamber matching, and one used in the disclosure herein, is—chambers are matched if their states of operation are matched. This requires that, in addition to matching process outputs, process conditions, such as process inputs and process variables, are also matched. Further details of the improved chamber matching (hereinafter, chamber matching) are described below.

Figure 2:
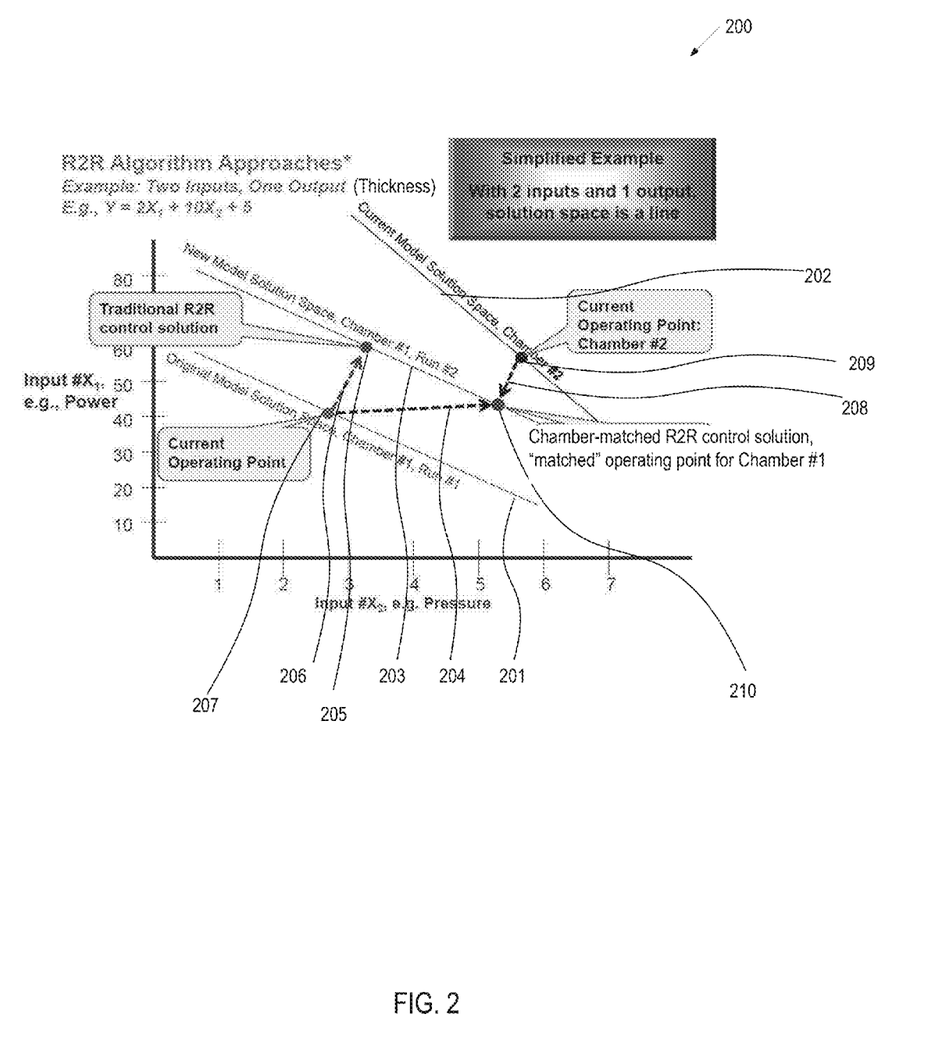
FIG. 2 provides a graphical illustration of chamber matching performed according to some aspects of the present disclosure.

FIG. 2 provides a graphical illustration of chamber matching performed according to some aspects of the present disclosure. In the figure below, an example with two inputs and one output (e.g., $Y=2X_1+10X_2+5$) is shown for ease of explanation. It should be noted the use of two inputs and one output is used for the ease of explanation and that chamber matching, as described herein, can be applied to multiple outputs and multiple inputs. In addition, chamber matching can be performed for more than 2 chambers. Chamber matching may be performed on a plurality of chambers of any number.

FIG. 2 illustrates chamber matching using model solution spaces, in accordance with one embodiment of the present invention. A model solution space refers to the range of input values (e.g., parameters) of a recipe advice that may achieve a specified output value. In the following example, the model solution space output (i.e., thickness) is held constant. However, in other examples, both the output and the input values of a model solution space may be variable. In graphical illustration 200, the model solution spaces are represented as straight lines (e.g., model solution spaces 201, 202, and 203). Model solution space 201 (e.g., original model solution space) is the model solution space for the first process run (e.g., run #1) of chamber 1. The tunable inputs are pressure (e.g., $X_2$) and power (e.g., $X_1$), while the output is thickness (e.g., Y). In model solution space 201, the determined solution for run #1 is seen at operating point 207 where the input parameters are approximately as follows: pressure=2.5, power=40.

Model solution space 202 (e.g., current model solution space, Chamber #2) is the model solution space for the first process run (e.g., run #1) of chamber 2. In model solution space 202, the determined solution for run #1 is seen at operating point 209 where the input parameters are approximately as follows: pressure=5.5, power=60.

Traditionally, R2R controllers choose a recipe advice that is closest to the previous advice, without taking into account other chambers performing the same process. For example, typically a chamber does not produce an output exactly as the recipe advice proscribes. In FIG. 2, operating point 207 may represent the output (e.g. thickness) of chamber 1 after run 1. However, the output may not be exactly what was intended. The intended output may be represented by operating point 205. In a traditional chamber matching approach, a R2R control system may try to move the operating point 207 (e.g., output) of chamber 1 closer to operating point 205 by minimally adjusting the tunable inputs (e.g., pressure and power). The minimal adjustments of a traditional chamber matching approach are represented by arrow 206. An R2R system may choose any of the input combinations to achieve the desired output as represented by model solution space 203. However, under the traditional chamber matching approach an R2R controller may adjust chamber 1's recipe advice by making the least adjustments possible while still approaching the desired operating point 205.

Graphical illustration 200 illustrates a simplified example of chamber matching in accordance with aspects of the present disclosure, where the advices of both chamber 1 and chamber 2 are adjusted to achieve a common output value and common input values. As illustrated, both the input and the output values of both chambers are matched. For example, the operating point 207 of chamber 1 after run 1 is adjusted, as represented by arrow 204, to operating point 210. Operating point 209 of chamber 2 after run 1 is also being adjusted, as represented by arrow 208, to the same operating point, operating point 210. As illustrated, the operating points of both chamber 1 and 2 are adjusted to operating point 210, and the inputs of both chambers have been tuned to approach the same values (e.g., approximately pressure=5 and power=40). In one embodiment, the recipe advices of each chamber in the matching group are tied to other chambers and improve the level of matching across chambers. In another embodiment, the chambers are moving towards a composite recipe, $X_c$. In another embodiment, parameter weighting and bounding are applied to the chamber matching effort.

Figure 3:
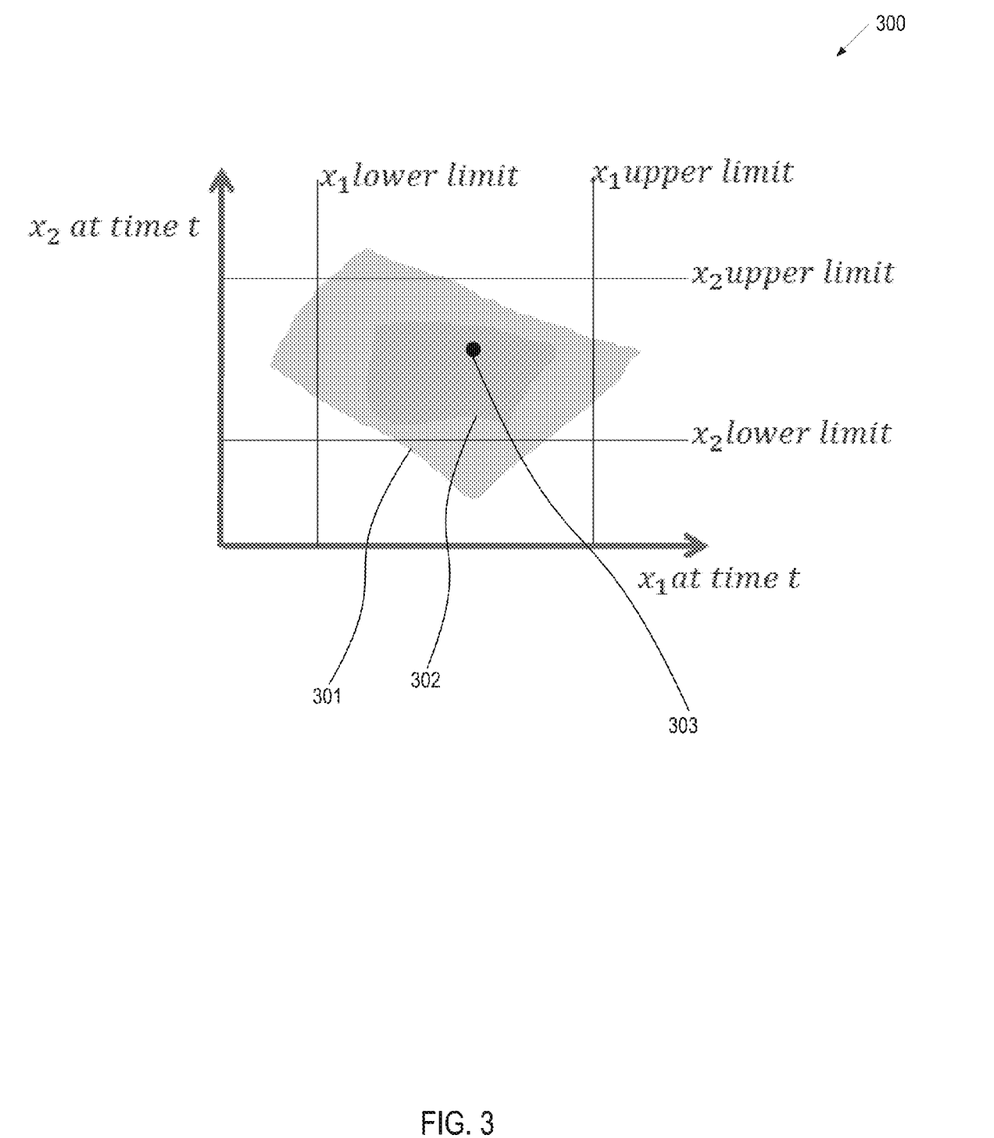
FIG. 3 illustrates a graphical representation of state space as applied to chamber matching, in accordance with one embodiment of the present invention.

FIG. 3 illustrates a graphical representation of state space as applied to chamber matching, in accordance with one embodiment of the present invention. State space refers to state-space methods of feedback control in system design and for design optimization. A state space description of system dynamics may provide the dynamics as a set of coupled first-order differential equations in a set of internal variables known as state variables, together with a set of algebraic equations that combine the state variables into physical output variables. Said differently, the concept of the state of a dynamic system refers to a minimum set of variables, known as state variables, that fully describe the system and its response to any given set of inputs. By applying state space control, additional variables may be controlled in the chamber matching effort. For example, the EWMA model, as discussed previously, can be extended to consider such factors as tool-specific history, time-dependent tool parameter noise, and time-dependent metrology measurement noise. State space control as applied to chamber matching may be graphically represented by FIG. 3, where space 301 represents the entire solution space (e.g., all possible input parameters). Space 302 illustrates only the possible solutions satisfying the constraints. Space 303 illustrates the optimal solution given the minimum value to the objective function. In this case, the objective function would include chamber matching objectives as described previously (e.g., matching of weighted inputs and outputs). The objectives would be combined with other control objectives in a weighted objective function.

The state space extensions as applied to chamber matching may also be described in mathematical form as follows:

$$y_t = A \cdot x_t + v_t$$

$$x_t + 1 = x_t + w_t$$

where, $y_t$=Metrology measurement at time t, $x_t$=tunable inputs at time t, A=output matrix, $w_t$=tunable input noise, $v_t$=SPC measurement noise;

$$\min_{x_t - x_{t+N}} \sum_{j=0}^{N} (y_{Target} - y_t)^T Q (y_{Target} - y_t) + (x_{t+1} - x_t)^T R (x_{t+1} - x_t)$$

where, $y_{Target}$=Metrology measurement target, Q=cost matrix for deviating from metrology measurement target, R=penalty matrix for moving away from current inputs, $\Delta x_{max}$=maximum change in inputs.

Subject to $$\begin{aligned} x_{min} \le x_j \le x_{max} \\ 0 \le x_{j+1} - x_j \le \Delta x_{max} \end{aligned}$$ → These constraints are designed such that chamber matching criteria are met $$A \cdot x_j = y_j - v_j$$

In one embodiment, matrix A is recipe dependent and tool independent and may be obtained from experimentation. In one embodiment, the noise parameters can be entered ahead of time if the distributions are known. In another embodiment, noise parameters can be estimated if not known. As applied to chamber matching, the above equation may be solved in order to find the optimal input.

Figure 4:
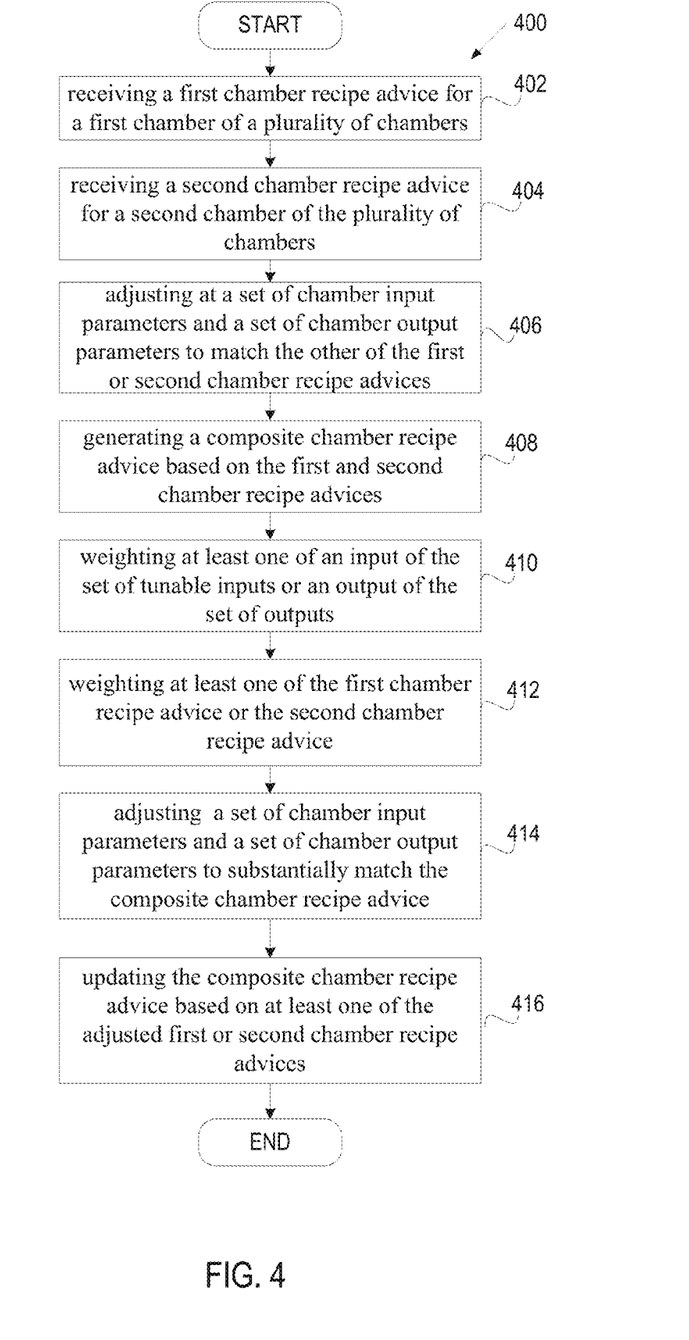
FIG. 4 is a flow diagram of one embodiment of a method for chamber matching.

FIG. 4 is a flow diagram of one embodiment of a method for chamber matching. The method 400 may be performed by processing logic that comprises hardware (e.g., circuitry, dedicated logic, programmable logic, microcode, etc.), software (e.g., instructions run on a processing device to perform hardware simulation), or a combination thereof.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 400 may be performed by chamber matching subsystem 145 as shown in FIG. 1A.

Referring to FIG. 4, method 400 begins at block 402, where processing logic receives a first chamber recipe advice for a first chamber of a plurality of chambers. The first chamber recipe advice may describe a set of tunable inputs (e.g., temperature and pressure) and a set of outputs (e.g., thickness) for a process. Additionally, the first chamber recipe advice includes a set of first chamber input parameters (e.g., values for temperature and pressure) to tune the set of tunable inputs and a set of first chamber output parameters (e.g., values of thickness) for the set of outputs.

At block 404 of method 400, processing logic receives a second chamber recipe advice for a second chamber. The second chamber recipe advice describes the set of tunable inputs (e.g., temperature and pressure) and the set of outputs (e.g., thickness) for the process. The second chamber recipe advice includes a set of second chamber input parameters (e.g., different values for temperature and pressure than chamber 1) to tune the set of tunable inputs and a set of second chamber output parameters (e.g., different values of thickness than chamber 1) for the set of outputs.

At block 406 of method 400, processing logic adjusts at least one of the set of first chamber input parameters (e.g., values for temperature and pressure) or the set of second chamber input parameters and at least one of the set of first chamber output parameters (e.g., values of thickness) or the set of second chamber output parameters to match the other of the first or second chamber recipe advices. In a simple two chamber example, the output parameters and input parameters of a first chamber may be adjusted to approximate the output and input parameters of a second chamber. In another embodiment, processing logic may adjust the input and output parameters of the chambers to approximate the input and output parameters of a composite chamber recipe, which will be described in more detail below.

In one embodiment, processing logic matches all input parameters and output parameters across chambers. In another embodiment, processing logic matches some but not all the input parameters and some or all of the output parameters across chambers.

At block 408 of method 400, processing logic generates a composite chamber recipe advice based on the first and second chamber recipe advices. A composite chamber recipe advice may be the average of all chamber recipes for a particular process. The composite recipe advice may include tunable inputs and outputs, and a set of composite input parameters and a set of output parameters to tune the tunable inputs and outputs, respectively. Note that the tunable inputs and outputs can be the same across chambers and the composite chamber recipe advice. However, typically the input and output parameters across chambers and between each chamber and the composite chamber recipe advice can vary. A composite chamber recipe advice may be used in a chamber matching effort where the recipe advice of each chamber is adjusted to approximate the composite chamber recipe advice. For example, the input parameters and the output parameters of a particular chamber recipe advice may be tuned to more closely approximate the input parameters and output parameters of the composite chamber recipe advice.

At block 410 of method 400, processing logic weights at least one input of the set of tunable inputs and/or at least one output of the set of outputs. The tunable inputs and/or outputs of a chamber may be weighted so that the particular weighted inputs or outputs of a chamber contribute more or less to the composite chamber recipe advice. It should be noted that for state space, as discussed in regards to FIG. 3, input weights correspond to the matrix R and output weights correspond do the matrix Q. Additionally, the tunable inputs and/or outputs of a chamber may be weighted so that the weighted inputs and/or outputs of a particular chamber move more or less towards the composite chamber recipe advice. In one embodiment, weighting of tunable inputs or outputs will allow a chamber to be matched to parameters that are most important. For example, if a customer's most important parameter is cycle time, the tunable input for cycle time may be weighted more than other tunable inputs.

At block 412 of method 400, processing logic weights chamber recipe advices of one or more chambers to adjust contribution of individual chambers to the composite recipe advice. In another embodiment, weighting of individual chambers may dictate the level to which a particular chamber contributes to, or derives advice from, the composite recipe advice. For example, a particular chamber may be considered a "golden chamber" and as such is chosen to be more heavily weighted so that it may contribute more than other chambers to the generation of a composite chamber recipe advice.

At block 414 of method 400, processing logic adjusts a set of chamber input parameters and a set of chamber output parameters to match the composite chamber recipe advice. In one embodiment, processing logic in the chamber matching effort adjusts each chamber's recipe advice to approximate the composite chamber recipe advice. For example, processing logic may adjust the input and output parameters of a chamber so that those parameters approach the input and output parameters of the composite chamber recipe advice.

At block 416 of method 400, processing logic updates the composite chamber recipe advice based on at least one of the adjusted first or second chamber recipe advices. In one embodiment, every time processing logic makes an R2R recipe advice adjustment to any chamber, the composite recipe advice is updated to reflect the adjustment of the particular chamber. Said differently, each time a chamber's recipe advice is updated to approximate the composite chamber recipe advice, the composite chamber recipe advice may then be updated to include the updated chamber recipe advice. The process of updating the composite chamber advice and the chamber recipe advice may be iterative.

In another embodiment, chamber matching may be based on state spaced control as described in FIG. 3. That is, chamber matching may be performed using state-space control methods where tunable inputs, outputs, and their associated parameters are described by state-space representations.

Figure 5:
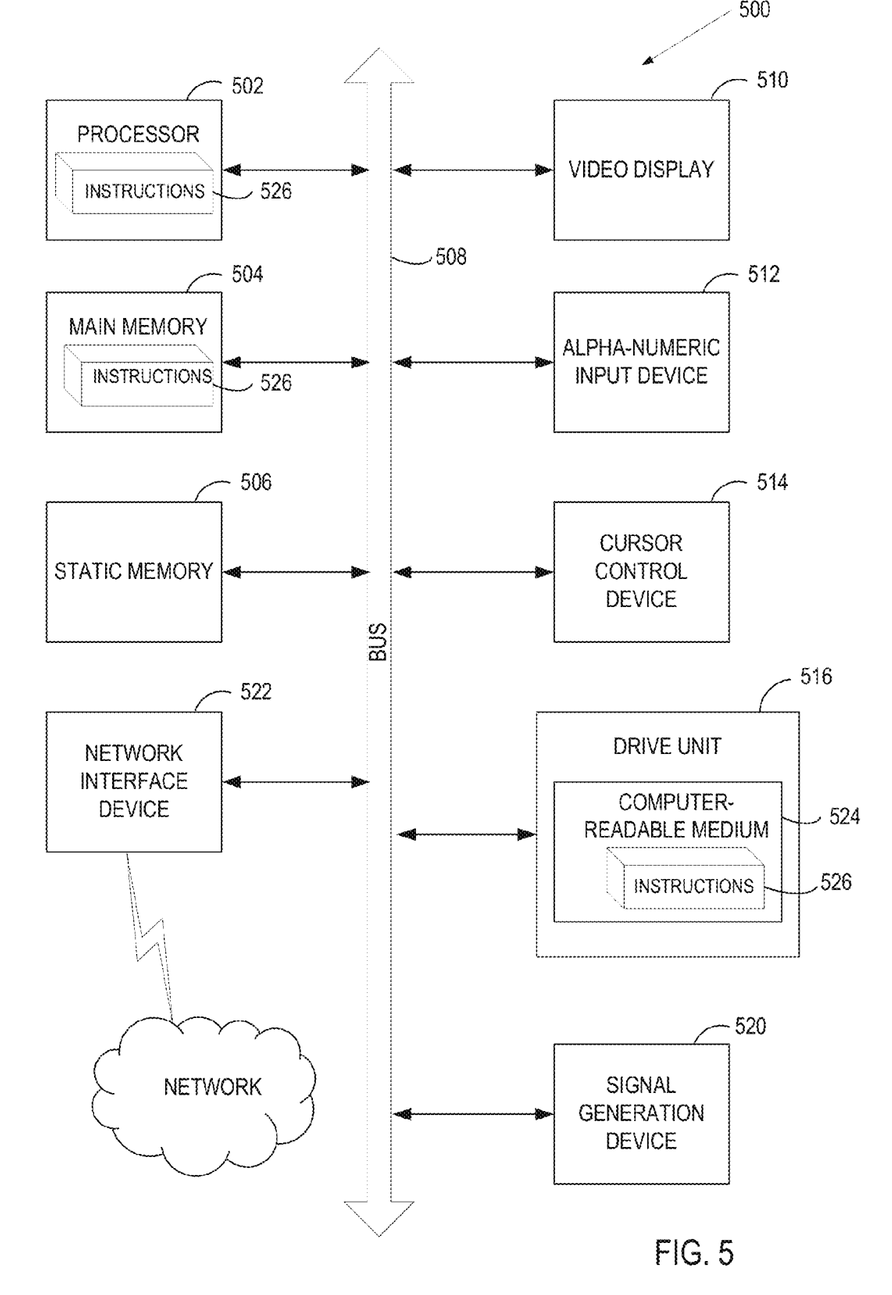
FIG. 5 illustrates a block diagram of an exemplary computer system, in accordance with one embodiment of the present invention.

FIG. 5 illustrates a diagrammatic representation of a machine in the exemplary form of a computer system 500 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 500 includes a processing device (processor) 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage device 518, which communicate with each other via a bus 508.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute instructions 526 for performing the operations and steps discussed herein.

The computer system 500 may further include a network interface device 522. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 520 (e.g., a speaker).

The data storage device 518 may include a computer-readable storage medium 524 on which is stored one or more sets of instructions 526 (e.g., software) embodying any one or more of the methodologies or functions described herein. The instructions 526 may also reside, completely or at least partially, within the main memory 504 and/or within the processor 502 during execution thereof by the computer system 500, the main memory 504 and the processor 502 also constituting computer-readable storage media. The instructions 526 may further be transmitted or received over a network 574 via the network interface device 522.

In one embodiment, the instructions 526 include instructions for implementing an chamber matching subsystem 145. While the computer-readable storage medium 524 is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present invention. The term "computer-readable storage medium" shall accordingly be taken to include, but not be limited to, solid-state memories, optical media, and magnetic media.

In the above description, numerous details are set forth. It will be apparent, however, to one of ordinary skill in the art having the benefit of this disclosure, that the present invention may be practiced without these specific details. In some instances, well-known structures and devices are shown in block diagram form, rather than in detail, in order to avoid obscuring the present invention.

Some portions of the detailed description that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "adjusting", "generating," "receiving", "weighting," "updating," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

What is claimed is:

1. A computer-implemented method, comprising:
   receiving a first chamber recipe advice for a first chamber of a plurality of chambers, the first chamber recipe advice describing a set of tunable inputs and a set of outputs for a process, wherein the first chamber recipe advice comprises a set of first chamber input parameters to tune the set of tunable inputs and a set of first chamber output parameters for the set of outputs;
   receiving a second chamber recipe advice for a second chamber of the plurality of chambers, the second chamber recipe advice describing the set of tunable inputs and the set of outputs for the process, wherein the second chamber recipe advice comprises a set of second chamber input parameters to tune the set of tunable inputs and a set of second chamber output parameters for the set of outputs;
   adjusting at least one of the set of first chamber input parameters or the set of second chamber input parameters and at least one of the set of first chamber output parameters or the set of second chamber output parameters to substantially match the first chamber recipe advice and the second chamber recipe advice; and
   generating, by a processing device, a composite chamber recipe advice based on the first and the second chamber recipe advices, the composite chamber recipe advice describing the set of tunable inputs and the set of outputs for the process, wherein the composite chamber recipe advice comprises a set of composite input parameters to tune the set of tunable inputs and a set of composite output parameters for the set of outputs.

2. The computer-implemented method of claim 1, further comprising:
   weighting at least one of an input of the set of tunable inputs or an output of the set of outputs.

3. The computer-implemented method of claim 1, further comprising:
   weighting at least one of the first chamber recipe advice or the second chamber recipe advice.

4. The computer-implemented method of claim 1, wherein at least one of the set of first chamber input parameters or the set of second chamber input parameters and at least one of the set of first chamber output parameters or the set of second chamber output parameters are adjusted based on state space control.

5. The computer-implemented method of claim 1, wherein adjusting at least one of the first or the second chamber recipe advices comprises adjusting at least one of the set of first chamber input parameters or the set of second chamber input parameters and at least one of the set of first chamber output parameters or the set of second chamber output parameters to substantially match the composite chamber recipe advice.

6. The computer-implemented method of claim 5, further comprising:
updating the composite chamber recipe advice based on at least one of the adjusted first or the adjusted second chamber recipe advices.

7. The computer-implemented method of claim 1, wherein generating the composite chamber recipe advice comprises generating the set of composite input parameters by averaging input parameters of the first and the second chamber recipe advices.

8. The computer-implemented method of claim 1, wherein generating the composite chamber recipe advice comprises averaging the first and the second chamber recipe advices.

9. The computer-implemented method of claim 1, wherein generating the composite recipe advice is further based on process conditions of the first and the second chambers, and wherein the process conditions of the first and the second chamber are adjusted to substantially match the generated composite recipe advice.

10. A system comprising:
a memory; and
a processing device coupled to the memory, the processing device configured to:
receive a first chamber recipe advice for a first chamber of a plurality of chambers, the first chamber recipe advice describing a set of tunable inputs and a set of outputs for a process, wherein the first chamber recipe advice comprises a set of first chamber input parameters to tune the set of tunable inputs and a set of first chamber output parameters for the set of outputs;
receive a second chamber recipe advice for a second chamber of the plurality of chambers, the second chamber recipe advice describing the set of tunable inputs and the set of outputs for the process, wherein the second chamber recipe advice comprises a set of second chamber input parameters to tune the set of tunable inputs and a set of second chamber output parameters for the set of outputs;
adjust at least one of the set of first chamber input parameters or the set of second chamber input parameters and at least one of the set of first chamber output parameters or the set of second chamber output parameters to substantially match the first chamber recipe advice and the second chamber recipe advice; and
generate a composite chamber recipe advice based on the first and the second chamber recipe advices, the composite chamber recipe advice describing the set of tunable inputs and the set of outputs for the process, wherein the composite chamber recipe advice comprises a set of composite input parameters to tune the set of tunable inputs and a set of composite output parameters for the set of outputs.

11. The system of claim 10, wherein the processing device is further to:
weight at least one of an input of the set of tunable inputs or an output of the set of outputs.

12. The system of claim 10, wherein the processing device is further to:
weight at least one of the first chamber recipe advice or the second chamber recipe advice.

13. The system of claim 10, wherein at least one of the set of first chamber input parameters or the set of second chamber input parameters and at least one of the set of first chamber output parameters or the set of second chamber output parameters are adjusted based on state space control.

14. The system of claim 10, wherein the processing device is further to:
adjust at least one of the first or the second chamber recipe advices comprising adjusting at least one of the set of first chamber input parameters or the set of second chamber input parameters and at least one of the set of first chamber output parameters or the set of second chamber output parameters to substantially match the composite chamber recipe advice.

15. The system of claim 14, wherein the processing device is further to:
update the composite chamber recipe advice based on at least one of the adjusted first or the adjusted second chamber recipe advices.

16. The system of claim 10, wherein generating the composite chamber recipe advice comprises generating the set of composite input parameters by averaging input parameters of the first and the second chamber recipe advices.

17. A non-transitory machine-readable storage medium storing instructions which, when executed, cause a processing device to perform operations comprising:
receiving a first chamber recipe advice for a first chamber of a plurality of chambers, the first chamber recipe advice describing a set of tunable inputs and a set of outputs for a process, wherein the first chamber recipe advice comprises a set of first chamber input parameters to tune the set of tunable inputs and a set of first chamber output parameters for the set of outputs;
receiving a second chamber recipe advice for a second chamber of the plurality of chambers, the second chamber recipe advice describing the set of tunable inputs and the set of outputs for the process, wherein the second chamber recipe advice comprises a set of second chamber input parameters to tune the set of tunable inputs and a set of second chamber output parameters for the set of outputs;
adjusting at least one of the set of first chamber input parameters or the set of second chamber input parameters and at least one of the set of first chamber output parameters or the set of second chamber output parameters to substantially match the first chamber recipe advice and the second chamber recipe advice; and
generating, by the processing device, a composite chamber recipe advice based on the first and the second chamber recipe advices, the composite chamber recipe advice describing the set of tunable inputs and the set of outputs for the process, wherein the composite chamber recipe advice comprises a set of composite input parameters to tune the set of tunable inputs and a set of composite output parameters for the set of outputs.

18. A non-transitory machine-readable storage medium of claim 17, further comprising:
adjusting at least one of the first or the second chamber recipe advices by adjusting at least one of the set of first chamber input parameters or the set of second chamber input parameters and at least one of the set of first chamber output parameters or the set of second chamber output parameters to substantially match the composite chamber recipe advice.

* * * * *